(12) United States Patent
Pullela et al.

(10) Patent No.: US 7,605,669 B2
(45) Date of Patent: Oct. 20, 2009

(54) SYSTEM AND METHOD FOR GENERATING LOCAL OSCILLATOR (LO) SIGNALS FOR A QUADRATURE MIXER

(75) Inventors: Rajasekhar Pullela, Colton, CA (US); Tirdad Sowlati, Irvine, CA (US); Dmitriy Rozenblit, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 215 days.

(21) Appl. No.: 11/429,032

(22) Filed: May 5, 2006

(65) Prior Publication Data
US 2007/0259642 A1 Nov. 8, 2007

(51) Int. Cl.
*H03B 27/00* (2006.01)
(52) U.S. Cl. .............................. 331/45; 331/74; 455/260
(58) Field of Classification Search .................. 331/74, 331/45, 175; 327/113, 115, 117, 231, 238, 327/246, 247, 250; 455/323, 260, 313
See application file for complete search history.

(56) References Cited

U.S. PATENT DOCUMENTS

| | | | |
|---|---|---|---|
| 6,711,395 B1 * | 3/2004 | Tonegawa et al. | 455/313 |
| 6,760,577 B2 * | 7/2004 | Li | 455/323 |
| 7,130,604 B1 * | 10/2006 | Wong et al. | 455/302 |
| 7,321,268 B2 * | 1/2008 | Chang et al. | 331/37 |
| 2004/0214547 A1 * | 10/2004 | Kim et al. | 455/296 |
| 2005/0215223 A1 * | 9/2005 | Lin et al. | 455/317 |
| 2005/0227636 A1 * | 10/2005 | Zachan et al. | 455/108 |

* cited by examiner

*Primary Examiner*—Robert Pascal
*Assistant Examiner*—Gerald Stevens (57) ABSTRACT

A system for generating local oscillator (LO) signals for a quadrature mixer includes an oscillator configured to provide a reference frequency signal, at least one frequency divider configured to divide the reference frequency signal into three offset phase signals, a first summing circuit configured to generate two nominal 90 degree offset phase signals from the three offset phase signals, and a second summing circuit configured to generate at least two amplitude-corrected 90 degree offset-phase quadrature signals.

18 Claims, 6 Drawing Sheets

SYSTEM AND METHOD FOR GENERATING LOCAL OSCILLATOR (LO) SIGNALS FOR A QUADRATURE MIXER

BACKGROUND

Radio frequency (RF) transmitters are found in many one-way and two-way communication devices, such as portable communication devices, (cellular telephones), personal digital assistants (PDAs) and other communication devices. An RF transmitter must transmit using whatever communication methodology is dictated by the particular communication system within which it is operating. For example, communication methodologies typically include amplitude modulation, frequency modulation, phase modulation, or a combination of these. In a typical global system for mobile communications (GSM) mobile communication system using narrowband TDMA technology, a Gaussian minimum shift keying (GMSK) modulation scheme supplies a clean phase-modulated (PM) transmit signal to a non-linear power amplifier directly from an oscillator.

In such an arrangement, a non-linear power amplifier, which is highly efficient, can be used, thus allowing efficient transmission of the phase-modulated signal and minimizing power consumption. Because the modulated signal is supplied directly from an oscillator, the need for filtering, either before or after the power amplifier, is minimized. Other transmission standards, such as that employed in IS-136, however, use a modulation scheme in which the transmitted signal is both phase modulated (PM) and amplitude modulated (AM). Standards such as these increase the data rate without increasing the bandwidth of the transmitted signal. Unfortunately, existing GSM transmitter hardware is not easily adapted to transmit a signal that includes both a PM component and an AM component. One reason for this difficulty is that in order to transmit a signal containing a PM component and an AM component, a highly linear power amplifier is required. Unfortunately, highly linear power amplifiers are very inefficient, thus consuming significantly more power than a non-linear power amplifier and drastically reducing the life of the battery or other power source.

This condition is further complicated because transmitters typically employed in GSM communication systems transmit in bursts and must be able to control the ramp-up of the transmit power as well as have a high degree of control over the output power level over a wide power range. In GSM this power control is typically performed using a closed feedback loop in which a portion of the signal output from the power amplifier is compared with a reference signal and the resulting error signal is fed back to the control port of the power amplifier.

The EDGE communication system attempts to increase the data transmission capability of a GSM communication system by including an amplitude modulation (AM) component in the transmit signal. However, when attempting to add an AM component to the GSM type modulation system, the power control loop will attenuate the amplitude variations present in the signal in an attempt to maintain a constant output power. In such an arrangement, the power control loop tends to cancel the AM portion of the signal.

Further, in those transmission standards in which both a PM signal and an AM signal are sent to a power amplifier, unless the power amplifier is very linear, it may distort the combined transmission signal by causing undesirable AM to PM conversion. This conversion is detrimental to the transmit signal and can require the use of a costly and inefficient linear power amplifier.

In the past, the transceiver components for such a communication system were typically implemented using multiple devices, also referred to as "chips." However, industry pressures to reduce cost, implementation complexity and power consumption and to extend battery life are driving the industry to attempt single chip architectures. Unfortunately, a single chip implementation for a GSM/EDGE transceiver presents many design challenges, especially in a system in which a closed power control loop is used to control output power of the transmitter. For example, when a closed loop power control system is implemented on the same chip as the transceiver components, the radio frequency (RF) on-chip isolation requirement between the components becomes a major factor affecting transceiver performance.

One of the advances in portable communication technology is the move toward the implementation of a low intermediate frequency (IF) receiver and a direct conversion receiver (DCR). A low IF receiver converts a radio frequency (RF) signal to an intermediate frequency that is lower than the IF of a convention receiver. A direct conversion receiver downconverts a radio frequency (RF) received signal directly to baseband (DC) without first converting the RF signal to an intermediate frequency (IF). One of the benefits of a direct conversion receiver is the elimination of costly filter components used in systems that employ an intermediate frequency conversion.

A low IF or a direct conversion receiver allows the filter components to be implemented using electronic circuitry that can be located on the same device (i.e., "on-chip") as many of the receiver components. In a direct conversion receiver implementation, high-order (e.g., fifth-order or higher) active filters are used to convert the received signal from RF to DC. Unfortunately, because the filters are implemented using electronic circuitry on the same chip as the receiver components, the filter adds significant noise to the received signal. The added noise reduces the sensitivity of the receiver, thereby making such an active filter challenging to implement.

When converting a received RF signal either to an intermediate frequency signal, or directly to a baseband signal, one or more mixers are used to downconvert the received RF signal. A mixer combines the received RF signal with a reference signal, referred to as a "local oscillator," or "LO" signal. The resultant signal is the received signal at a different, and typically lower, frequency.

In a quadrature mixer, an in-phase signal component and a quadrature-phase signal component are presented to the mixer. At the RF frequency of the received signal, the in-phase signal component and the quadrature-phase signal component are offset in phase by a nominal 90 degrees. When implementing a mixer to downconvert a complex quadrature signal, either the RF path or the LO path must be phase-shifted to obtain the desired downconversion characteristics. For many reasons, it is desirable to phase-shift the LO signals. For example, phase-shifting the LO signals eliminates the need for costly and inefficient so-called "polyphase" filters in the RF path. Typically the LO signal is either at the RF frequency of the received signal (regular mixer) or at a fraction of the RF signal (subharmonic mixer). In a subharmonic mixer, the 90 degree phase offset between the in-phase signal component and a quadrature-phase signal component equates to a 45 degree phase offset between the LO signals when the frequency of the LO signal is one half the frequency of the RF signal.

Regardless of the mixer topology, it is desirable to efficiently generate the LO signals for a quadrature mixer.

SUMMARY

Embodiments of the invention include a system for generating local oscillator (LO) signals for a quadrature mixer, comprising an oscillator configured to provide a reference frequency signal, at least one frequency divider configured to divide the reference frequency signal into three offset phase signals, a first summing circuit configured to generate two nominal 90 degree offset phase signals from the three offset phase signals, and a second summing circuit configured to generate at least two amplitude-corrected 90 degree offset-phase quadrature signals.

Other embodiments are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Although described with particular reference to a portable transceiver operating in the GSM communication system, the system and method for generating local oscillator (LO) signals for a quadrature mixer can be implemented in any receiver implementing a mixer to downconvert a radio frequency (RF) signal. Further, some of the description to follow will describe the system and method for generating local oscillator (LO) signals for a quadrature mixer as generating LO signals for a subharmonic mixer. However, both conventional and subharmonic mixer LO signals can be generated.

The system and method for generating local oscillator (LO) signals for a quadrature mixer can be implemented in hardware, software, or a combination of hardware and software. When implemented in hardware, the system and method for generating local oscillator (LO) signals for a quadrature mixer can be implemented using specialized hardware elements and logic. When the system and method for generating local oscillator (LO) signals for a quadrature mixer is implemented partially in software, the software portion can be used to precisely control the various components in the receiver. The software can be stored in a memory and executed by a suitable instruction execution system (microprocessor). The hardware implementation of the system and method for generating local oscillator (LO) signals for a quadrature mixer can include any or a combination of the following technologies, which are all well known in the art: discrete electronic components, a discrete logic circuit(s) having logic gates for implementing logic functions upon data signals, an application specific integrated circuit having appropriate logic gates, a programmable gate array(s) (PGA), a field programmable gate array (FPGA), etc.

The software for the system and method for generating local oscillator (LO) signals for a quadrature mixer comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance, optical scanning of the paper or other medium, then compiled, interpreted or otherwise processed in a suitable manner if necessary, and then stored in a computer memory.

Figure 1:
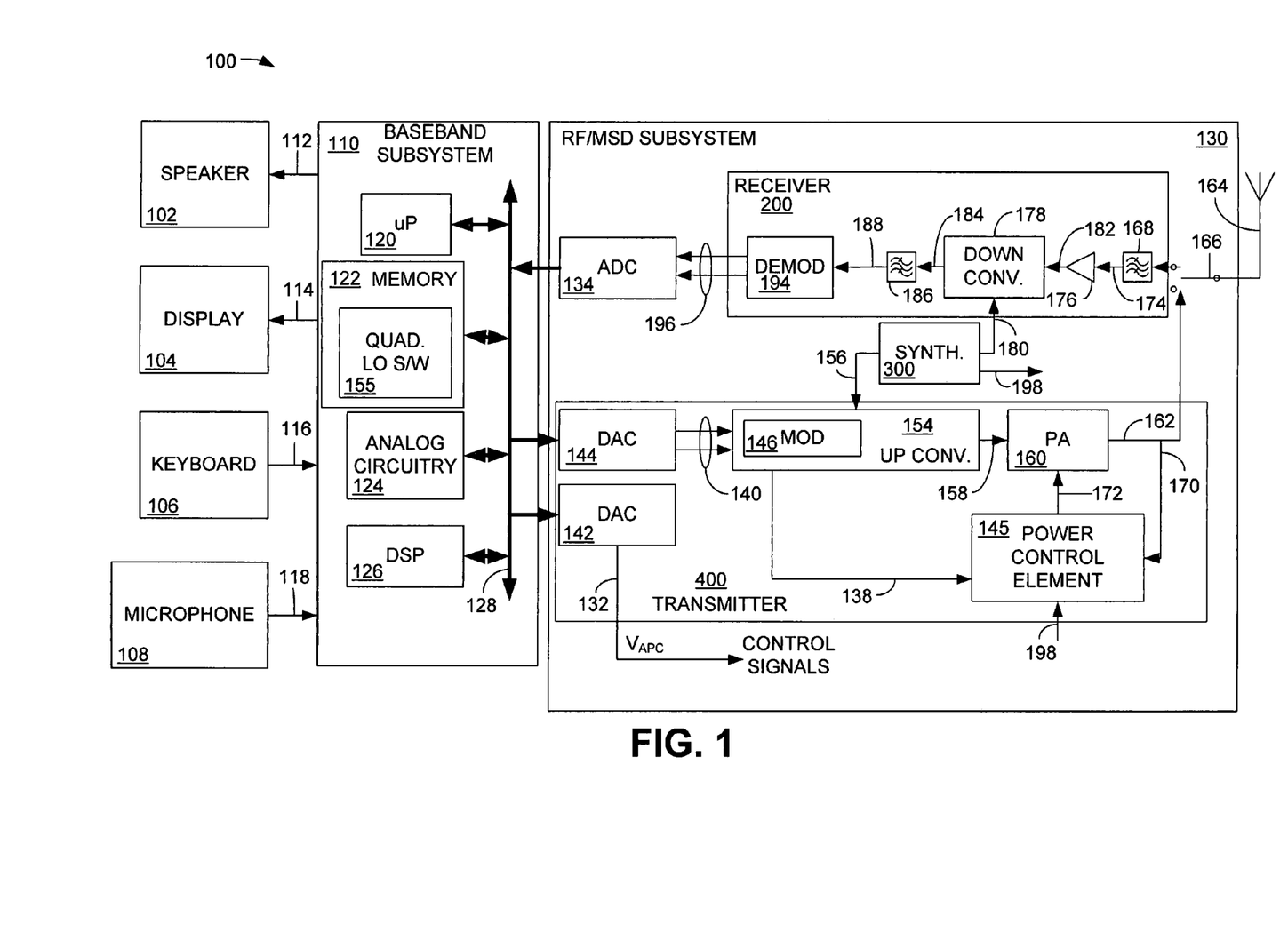
FIG. 1 is a block diagram illustrating a simplified portable transceiver.

FIG. 1 is a block diagram illustrating a simplified portable transceiver 100. The portable transceiver 100 includes speaker 102, display 104, keyboard 106, and microphone 108, all connected to baseband subsystem 110. In a particular embodiment, the portable transceiver 100 can be, for example but not limited to, a portable telecommunication handset such as a mobile cellular-type telephone. The speaker 102 and the display 104 receive signals from the baseband subsystem 110 via connections 112 and 114, respectively, as known to those skilled in the art. Similarly, the keyboard 106 and the microphone 108 supply signals to the baseband subsystem 110 via connections 116 and 118, respectively. The baseband subsystem 110 includes microprocessor (μP) 120, memory 122, analog circuitry 124, and digital signal processor (DSP) 126 in communication via bus 128. The bus 128, though shown as a single connection, may be implemented using a number of busses connected as necessary among the subsystems within baseband subsystem 110. The microprocessor 120 and the memory 122 provide the signal timing, processing and storage functions for the portable transceiver 100. If portions of the system and method for generating local oscillator (LO) signals for a quadrature mixer are implemented in software, then the memory 122 also includes quadrature LO software 155 that can be executed by the microprocessor 120, the DSP 126 or by another processor.

The analog circuitry 124 provides the analog processing functions for the signals within the baseband subsystem 110. The baseband subsystem 110 communicates with the radio frequency (RF)/mixed signal device (MSD) subsystem 130 via the bus 128.

The RF/MSD subsystem 130 includes both analog and digital components. Generally, the RF/MSD subsystem 130 includes a receiver 200, a synthesizer 300 and a transmitter 400. In this example, the RF/MSD subsystem 130 includes an analog-to-digital converter 134, and the transmitter 400 includes one or more digital-to-analog converters (DACS) 142 and 144.

In one embodiment, the baseband subsystem 110 provides an automatic power control signal (supplied as an analog voltage signal and referred to as $V_{APC}$) to the RF/MSD subsystem 130. Although shown as a single connection 132, the control signals may originate from the DSP 126 from the microprocessor 120, or from another element, and are supplied to a variety of points within the RF/MSD subsystem 130 by the DAC 142. It should be noted that, for simplicity, only the basic components of portable transceiver 100 are illustrated.

The ADC 134, the DAC 142 and the DAC 144 also communicate with microprocessor 120, memory 122, analog circuitry 124 and DSP 126 via bus 128. The DAC 144 converts the digital communication information within baseband subsystem 110 into an analog signal for transmission by the transmitter 400 via connection 140. Connection 140, while shown as two directed arrows, includes the information that is to be transmitted by RF/MSD subsystem 130 after conversion from the digital domain to the analog domain.

The DAC 144 may operate on either baseband in-phase (I) and quadrature-phase (Q) components or phase and amplitude components of the information signal. In the case of I and Q signals, the modulator 146 is an I/Q modulator as known in the art while in the case of phase and amplitude components, the modulator 146 operates as a phase modulator utilizing only the phase component and passes the amplitude component, unchanged, to the power control element 145. The DAC 142 supplies various other control signals to various components within the RF/MSD subsystem 130 via connection 132.

The modulator 146 modulates either the I and Q information signals or the phase information signal received from the DAC 144 onto a frequency reference signal referred to as a "local oscillator" or "LO" signal provided by the synthesizer 300 via connection 156. In this example, the modulator 146 is part of the upconverter 154, but need not be.

The modulator 146 also supplies an intermediate frequency (IF) signal containing only the desired amplitude modulated (AM) signal component on connection 138 for input to the power control element 145 via connection 138. The AM signal supplied by the modulator via connection 138 is first supplied to a reference variable gain element associated with the RF/MSD subsystem 130. The AM signal supplied by the modulator 146 is an intermediate frequency (IF) AM signal with a constant (average) power level that is supplied as a reference signal to the reference variable gain element to be described below.

The synthesizer 300, which will be described below, determines the appropriate frequency to which the upconverter 154 will translate the modulated signal. In this embodiment, the synthesizer uses a single voltage controlled oscillator (VCO), operating at a center frequency of approximately 2.5 to 3.0 gigahertz (GHz) in this example, and only frequency dividers to provide the desired LO signals to the transmitter 400 and to the receiver 200.

The upconverter 154 supplies a phase modulated signal at the appropriate transmit frequency via connection 158 to the power amplifier 160. The power amplifier 160 amplifies the phase modulated signal on connection 158 to the appropriate power level for transmission via connection 162 to antenna 164. Illustratively, switch 166 controls whether the amplified signal on connection 162 is transferred to antenna 164 or whether a received signal from antenna 164 is supplied to filter 168. The operation of switch 166 is controlled by a control signal from baseband subsystem 110 via connection 132.

In one embodiment, a portion of the amplified transmit signal power on connection 162 can be supplied via connection 170 to power control element 145. In this embodiment, the power control element 145 forms a continuous closed power control feedback loop and supplies an information signal on connection 172 instructing the power amplifier 160 as to the power to which the signal on connection 158 should be amplified. The power control element 145 also receives an LO signal from the synthesizer 300 via connection 198. In this embodiment, a synthesizer 300 having a single VCO supplies all of the required LO signals to the receiver 200 and the transmitter 400.

A signal received by antenna 164 may, at the appropriate time determined by baseband subsystem 110, be directed via switch 166 to a receive filter 168. The receive filter 168 filters the received signal and supplies the filtered signal on connection 174 to a low noise amplifier (LNA) 176. Although a single LNA 176 is shown in FIG. 1, it is understood that a plurality of LNAs are typically used, depending on the frequency or frequencies on which the portable transceiver 100 operates. The receive filter 168 may be a bandpass filter that passes all channels of the particular cellular system where the portable transceiver 100 is operating. As an example, for a 900 MHz GSM system, receive filter 168 would pass all frequencies from 925.1 MHz to 959.9 MHz, covering all 175 contiguous channels of 200 kHz each. The purpose of the receive filter 168 is to reject all frequencies outside the desired region. The LNA 176 amplifies the very weak signal on connection 174 to a level at which downconverter 178 can translate the signal from the transmitted frequency back to a baseband frequency. Alternatively, the functionality of the LNA 176 and the downconverter 178 can be accomplished using other elements, such as, for example but not limited to, a low noise block downconverter (LNB). In this example, the receiver 200 operates as a direct conversion receiver (DCR) in which the received RF signal is downconverted directly to a baseband signal. In one embodiment, the LNA 176 is fully differential and operates without inductances and baluns and using no voltage gain such that large electric fields are eliminated at the input to the LNA 176.

The downconverter 178 receives one or more LO signals from synthesizer 300 via connection 180. In an embodiment in which a subharmonic mixer is implemented, the LO signals are shifted in phase by approximately 45 degrees to provide frequency translation of the in-phase and the quadrature-phase received signals without the use of poly-phase filters or large inductances in the receive signal path. However, the system and method for generating local oscillator (LO) signals for a quadrature mixer is not limited to a subharmonic mixer. Any mixer architecture can use the LO signals generated in accordance with embodiments of the invention.

The synthesizer 300 determines the frequency to which to downconvert the signal received from the LNA 176 via connection 182. In the case of a DCR, the received signal is converted directly to baseband (DC), or near-baseband. The downconverter 178 sends the downconverted signal via connection 184 to a channel filter 186, also called the "IF filter." The channel filter 186 selects the one desired channel and rejects all others. Using the GSM system as an example, only one of the 175 contiguous channels is actually to be received. After all channels are passed by the receive filter 168 and downconverted in frequency by the downconverter 178, only the one desired channel will appear precisely at the center frequency of channel filter 186. The synthesizer 300, by controlling the local oscillator frequency supplied on connection 180 to downconverter 178, determines the selected channel. The demodulator 194 recovers the transmitted analog information and supplies a signal representing this information via connection 196 to the ADC 134. The ADC 134 converts these analog signals to a digital signal at baseband frequency and transfers it via bus 128 to DSP 126 for further processing.

Figure 2:
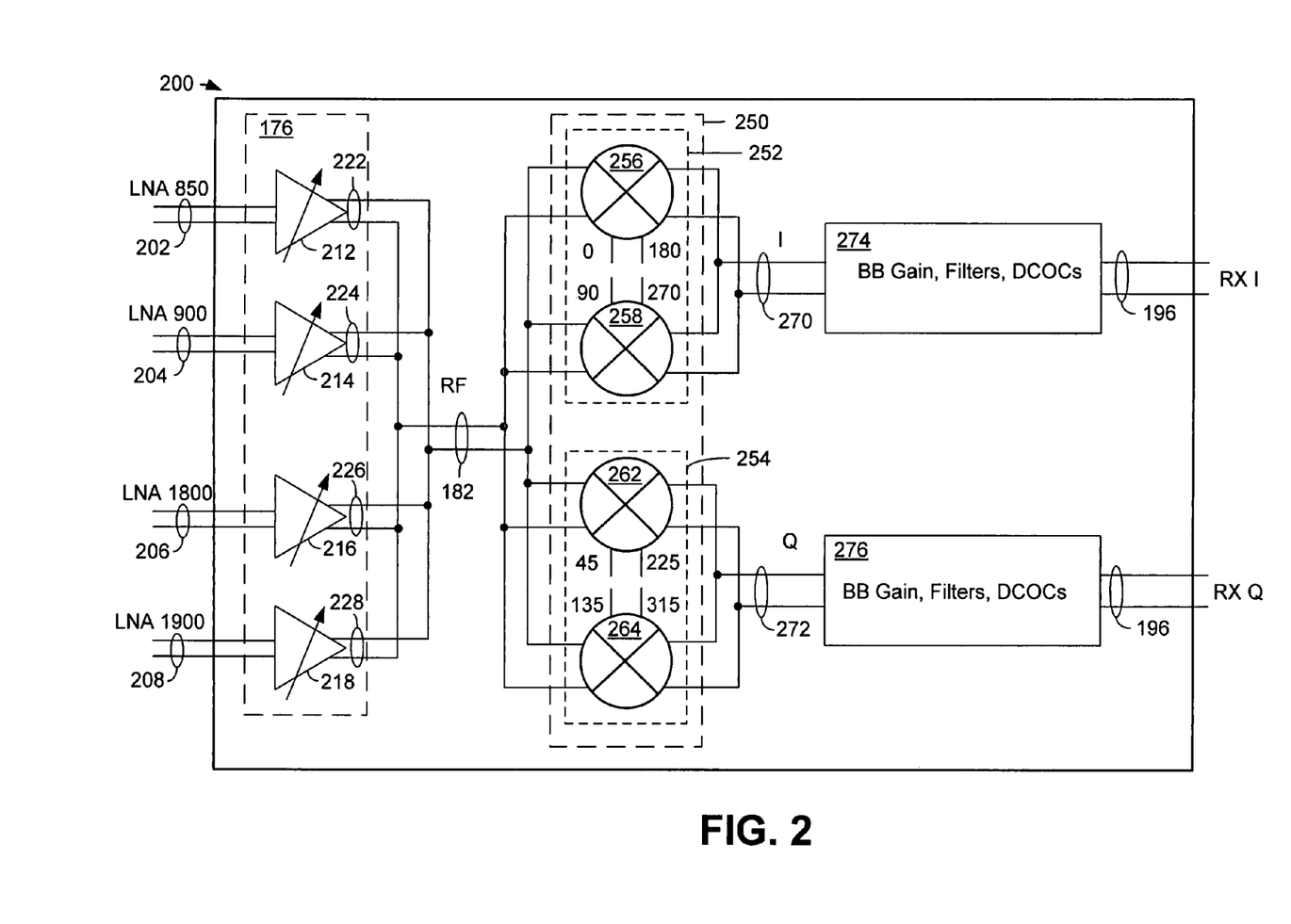
FIG. 2 is a schematic diagram illustrating the receiver of FIG. 1.

FIG. 2 is a schematic diagram illustrating the receiver 200 of FIG. 1. The depiction of the receiver 200 in FIG. 2 is simplified to illustrate primarily an example of a GSM/EDGE transceiver architecture that pertains to the receiver 200. Other receiver architectures may be implemented that use the LO signals generated in accordance with embodiments of the invention. The receiver 200 includes an LNA section 176, a downconverter section illustrating using mixer 250 and both in-phase and quadrature-phase gain and filter elements 274 and 276. In this embodiment, the LNA section 176 comprises LNAs 212, 214, 216 and 218, each designed to receive a signal in a particular transmission frequency band. The LNAs 212, 214, 216 and 218, and all the elements in the receiver to be described below, are fully differential, thereby eliminating the need for single ended to differential conversion circuitry. In this example, the LNAs 212 and 214 operate in the GSM communication band and the LNAs 216 and 218 operate in the PCS communication band. The LNA 212 is designed to receive a differential 850 MHz receive signal via connection 202 and the LNA 214 is designed to receive a differential 900 MHz receive signal via connection 204. The LNA 216 is designed to receive a differential 1800 MHz receive signal via connection 206 and the LNA 218 is designed to receive a differential 1900 MHz receive signal via connection 208. The outputs of the LNAs 212, 214, 216, and 218 are supplied via connection 182 directly to the mixer 250. In this embodiment, the fully differential LNAs 212, 214, 216 and 218 are designed, so that large passive BALUNs that perform single-ended to differential conversion are avoided. This design eliminates the polyphase networks that were previously used for generating I/Q quadrature signals at the RF frequency. Quadrature phases of received signal are instead generated by phase shifting the LO signals, as will be described below. In this manner, a receive signal at the input of the LNAs 212, 214, 216 and 218 experiences minimal loss, and requires little or no additional amplification through the receiver 200.

To provide the in-phase and quadrature-phase downconversion, in this embodiment, the mixer 250 is a sub-harmonic mixer designed to operate using sub-harmonic frequency, phase shifted LO signals instead of a phase shifted RF signal. Using phase shifted LO signals, the generation of which will be described below, allows the receiver 200 to be free of costly and power consuming so called "poly-phase" filter networks. In the past, the phase of the received RF signal was shifted by one or more poly-phase filter networks to achieve the in-phase and quadrature-phase downconversion. In the GSM/EDGE transceiver architecture described herein, the mixer 250 employs broadband phase generation circuitry to generate the LO signals that perform the downconversion, thereby eliminating the need for the poly-phase filters. The use of a broadband phase generation technique for generating the LO signals allows the output of the LNAs 212, 214, 216 and 216 to be combined and supplied to a single mixer 250. This leads to a reduction in die size and a simplified receiver design. In this embodiment, the signal path from the input of the LNA section 176 to the output of the mixer 250 is fully differential, thus reducing DC offset, receiver self-mixing, frequency variations between the in-phase and quadrature-phase channels, and minimizing degradation of the signal-to-noise ratio (s/n) and leakage of the transmit signal through the receive path.

Further, because there is no additional amplification used in the receiver 200, the power consumption of the receiver 200 is minimized.

The mixer 250 comprises in-phase mixer element 252 and quadrature-phase mixer element 254. The in-phase mixer element 252 includes mixer cores 256 and 258. The quadrature-phase mixer element 254 comprises mixer cores 262 and 264. The received RF signal is coupled via connection 182 to the mixer cores 256, 258, 262 and 264. The mixer cores 256, 258, 262 and 264 receive phase-shifted LO signals from the synthesizer 300, which will be described in detail below. By employing phase-shifted LO signals, the RF input signal supplied to the mixer stays intact, thus eliminating the need for a phase shifting network (such as one or more poly-phase filters) in the RF path. Further, the use of fully differential LNA section 176 and the single mixer 250 substantially improve the second intercept point (IP2) performance of the receiver 200 to the point where IP2 calibration is not necessary.

The ability to use a single mixer 250 allows the die area consumed by the receiver 200 to be minimized and simplifies the layout of the integrated circuit on which the receiver 200 is fabricated. Further, simplifying the layout of the integrated circuit minimizes parasitic capacitances, makes the receiver design more symmetrical than if two or more mixers were used, and simplifies and minimizes gain receive calibration for different receive bands. Further, minimizing the voltage of the RF signal prior to the mixer 250 helps minimize RF self-mixing, which can occur if a large RF voltage couples or radiates onto the LO ports of the mixer 250. Further, a fully differential path from the input of the down-converter to its output (i.e., from the input to the LNA section 176 to the output of the in-phase and quadrature-phase gain and filter elements 274 and 276) allows the minimization of another second order intercept point (IP2) mechanism, which is related to asymmetric analog processing of the positive and negative half-waveform of the input signal.

In this embodiment, 0 degree and 180 degree LO signals are supplied to the mixer core 256, 90 degree and 270 degree LO signals are supplied to the mixer core 258, 45 degree and 225 degree LO signals are supplied to the mixer core 262, and 135 degree and 315 degree LO signals are supplied to the mixer core 264. The differential output of the in-phase mixer element 252 is supplied via connection 270 to the in-phase gain and filter element 274, and the differential output of the quadrature-phase mixer element 254 is supplied via connection 272 to the quadrature-phase gain and filter element 276. The baseband section of the receiver 200, illustrated as the baseband gain and filtering elements 274 and 276 provide gain, channel select filtering that enables the receiver 200 to meet the GSM standard, and DC offset compensation (DCOC). Various stages of filtering, followed by gain are employed, as known in the art.

The differential output of the in-phase gain and filter element 274 and the differential output of the quadrature-phase gain and filter element 276 is supplied via connection 196 to the ADC 134 (FIG. 1) for conversion to the digital domain and further processing the baseband subsystem 110.

Figure 3:
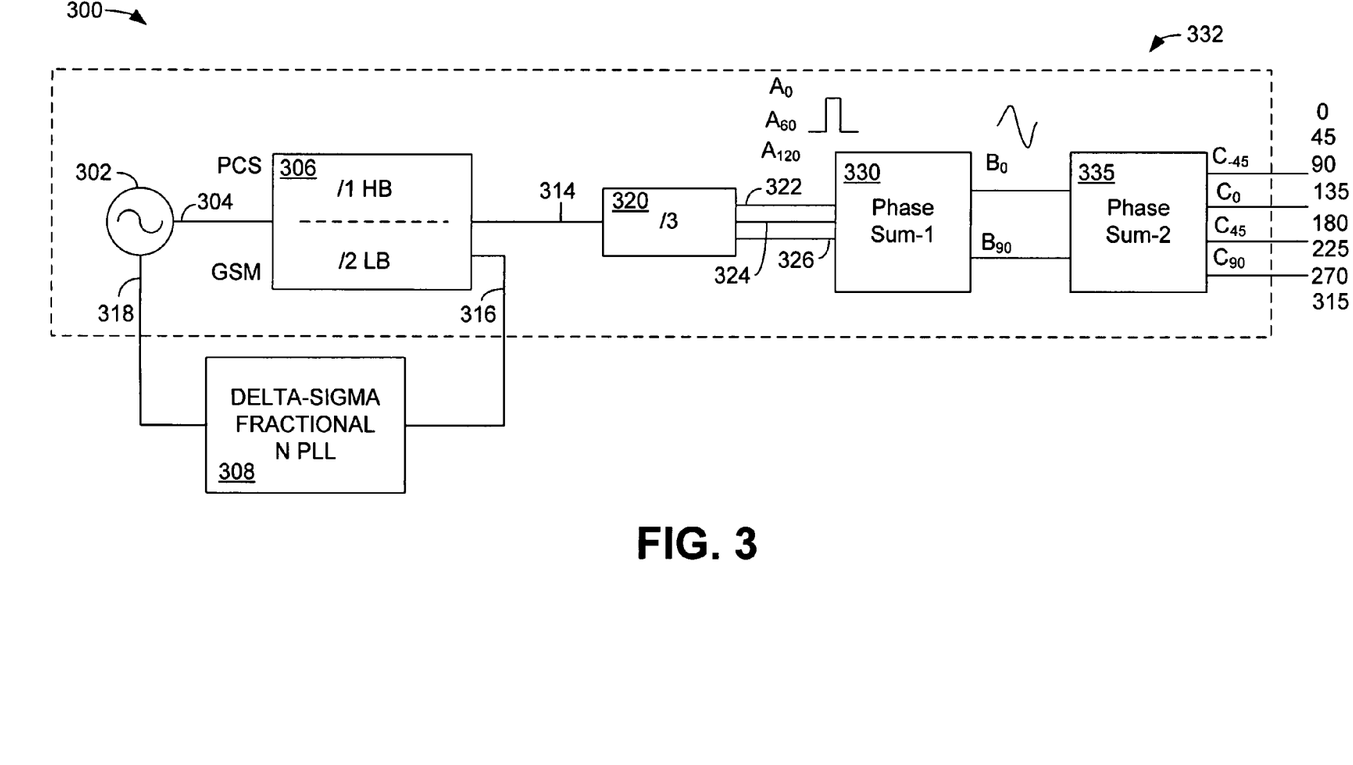
FIG. 3 is a schematic diagram of the synthesizer of FIG. 1.

FIG. 3 is a schematic diagram of the synthesizer 300 of FIG. 1. The synthesizer 300 includes a voltage controlled oscillator 302 (VCO) designed to operate approximately in the 2.5-3.0 gigahertz (GHz) frequency range, and in one embodiment, has a center frequency of approximately 2.8 GHz and a tuning range of approximately +/−250 megahertz (MHz). The output of the VCO 302 is supplied via connection 304 to a frequency divider 306. In this embodiment, when used for high band operation in the PCS 1800/1900 frequency band, the frequency divider 306 divides the input frequency on connection 304 by one (1). When used for low band operation in the GSM 850/900 frequency band, the frequency divider 306 divides the input frequency on connection 304 by two (2).

When used to supply signals to the receiver 200, the output of the frequency divider 306 is sent via connection 314 to another frequency divider 320. The frequency divider 320 divides the frequency of the signal on connection 314 by three (3) and supplies outputs on connections 322, 324 and 326 to a first phase summation element 330. The output of the frequency divider 320 comprises 0 degree, 60 degree and 120 degree signals on connections 322, 324 and 326, respectively. The 0 degree, 60 degree and 120 degree signals on connections 322, 324 and 326 are square wave signals that will be converted to sine wave signals having the appropriate signal phase by the first phase summation element 330 and the second phase summation element 335.

The use of a VCO 302 operating at approximately 2.8 GHz, and the frequency dividers 306 and 320 eliminate the need for frequency multipliers in the synthesizer 300. As compared to frequency multipliers, frequency dividers occupy less die area on the integrated circuit chip, generate less noise and consume less power. The dividers 306 and 320 generally provide a wide range of operation while maintaining the phase accuracy of the input signals and provide a consistent harmonic content.

The /2 low band output of the frequency divider 306 is supplied via connection 316 to a phase locked loop (PLL) 308. In this embodiment, the phase locked loop 308 is a delta-sigma fractional N phase locked loop. The output of the phase locked loop 308 is supplied via connection 318 as feedback to the VCO 302.

Figure 4:
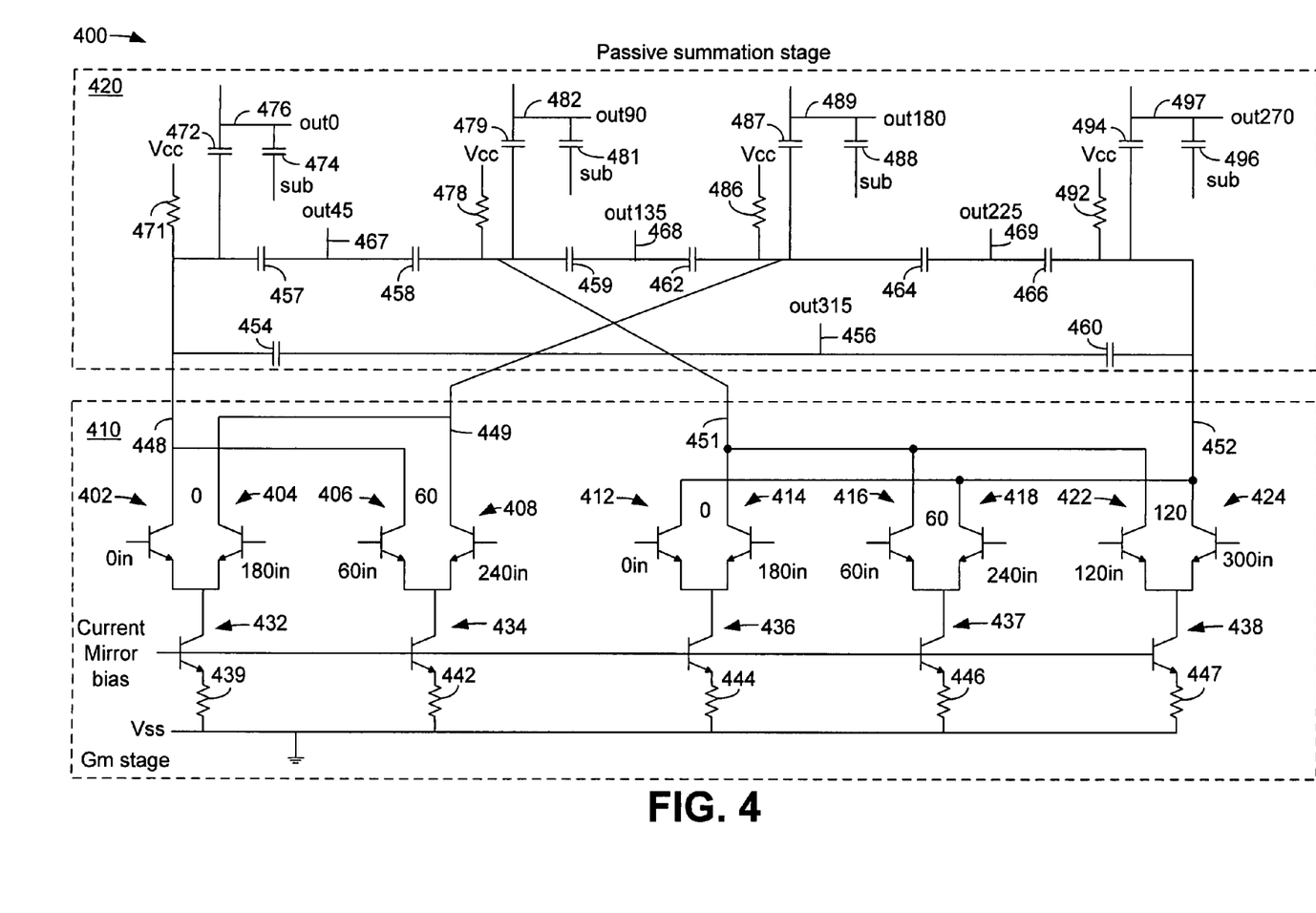
FIG. 4 is a schematic diagram illustrating an embodiment of the summation elements of FIG. 3.

The first phase summation element 330 converts the 0 degree, 60 degree and 120 degree signals on connections 322, 324 and 326 to 0 degree and 90 degree sine wave signals (relative to each other) according to the following equations. The vectors $A_0$, $A_{60}$, $A_{120}$ are the square wave outputs of the divide by 3 element 320 on connections 322, 324 and 326, respectively. The fundamental harmonic components of these square waves are offset from each other, $A_0$, $A_{60}$, and $A_0$, $A_{120}$, by 60 and 120 degrees, respectively. The fundamental components can be added or subtracted from each other to realize various phases of the fundamental frequency. However, the presence of $3^{rd}$, $5^{th}$, $7^{th}$ and higher harmonics in the square wave inputs to the summation elements 330 and 335 creates an error in the LO phases when the output of the phase summation elements 330 or 335 is applied to one or more limiting buffers (not shown) before the mixer (FIG. 2). The method of summing phases shown below realizes the required phases at the fundamental frequency, while eliminating the third harmonics. Fifth and higher order harmonics are eliminated by the inherent low pass filtering effect of the non-ideal (limited bandwidth) circuit components used for phase summation (FIG. 4). The outputs of the phase summation elements 330 and 335, which are sinusoidal signals at the fundamental frequency, without significant higher order harmonics, are supplied to the limiting buffers (not shown) that drive the mixer (FIG. 2).

$A_0$=sin($\omega$t)+(⅓)sin(3 wt); $A_{60}$=sin($\omega$t+60)+(⅓)sin(3 wt+180); $A_{120}$=sin($\omega$t+120)+(⅓)sin(3 wt+360). In this example, the $5^{th}$ and higher order harmonics that will be significantly reduced by low pass filtering are ignored.

$$B_0 = \sqrt{3}(A_0 + A_{60}) = \sqrt{3}\{\sin(\omega t) + (1/3)\sin(3\omega t)\} +$$
$$\sqrt{3}\{\sin(\omega t + 60) + (1/3)\sin(3\omega t + 180)\}$$
$$= \sqrt{3}\{\sin(\omega t) + \sin(3\omega t + 60)\} + (1/\sqrt{3})$$
$$\{\sin(3\omega t) + \sin(3\omega t + 180)\}$$
$$= 3\sin(\omega t + 30)$$
$$B_{90} = -A_0 + A_{60} + 2A_{120}$$
$$= \{-\sin(\omega t) - (1/3)\sin(3\omega t)\} + \{\sin(\omega t + 60) +$$
$$(1/3)\sin(3\omega t + 180)\} + 2\{\sin(\omega t + 120) +$$
$$(1/3)\sin(wt + 360)\}$$
$$= \{-\sin(\omega t) + \sin(\omega t + 60) + 2\sin(\omega t + 120)\} +$$
$$(1/3)\{-\sin(3\omega t) + \sin(3\omega t + 180) + 2\sin(3\omega t + 360)\}$$
$$= \{\sin(\omega t + 120) + 2\sin(\omega t + 120)\} +$$
$$\{-2\sin(3\omega t) + 2\sin(3\omega t + 360)\}$$
$$= 3\sin(\omega t + 120)$$

The second phase summation element 335 generates the final quadrature phase LO signals according to the following equations. The following equations also show the generation of LO signals suitable for a subharmonic mixer. However, in a conventional mixer the nominal LO signal would be twice the frequency as that used in the sub-harmonic mixer implementation described here and only the 45 and −45 degree signals would be implemented.

$C_0 = \sqrt{2} B_0$ (LO for I-channel)
$C_{45} = B_0 + B_{90}$ (LO for Q-channel)
$C_{90} = \sqrt{2} B_{90}$ (LO for I-channel)
$C_{-45} = B_0 - B_{90}$ (LO for Q-channel From the 0, 45, 90 and −45 degree signals, 0, 45, 90, 135, 180, 225, 270 and 315 degree LO signals can be generated.

It is known in theory that when two quadrature vectors are added and subtracted to generate quadrature signals, as in $C_{45} = B_0 + B_{90}$ and $C_{-45} = B_0 - B_{90}$, any quadrature error or amplitude error in the starting quadrature vectors $B_0$, $B_{90}$ does not affect the quadrature relationship of the final vectors $C_{45}$ or $C_{-45}$ to the first order. In other words, if $C_{45}$ and $C_{-45}$ were used in a regular mixer configuration as the I and Q LO signals, respectively, very accurate quadrature phases can be obtained due to the above described first order correction. It can also be shown that to first order, similar correction is obtained in the effective I and Q quadrature phases for the LO signals when the above scheme is used in a sub-harmonic mixer. Assuming that there are no mismatches in the summation circuitry, it can be shown in theory, and confirmed by simulation, that the above-described method of generating quadrature phases is substantially immune to first order distortion, and substantially immune to phase and amplitude mismatches in initial quadrature vectors $B_0$ and $B_{90}$.

FIG. 4 is a schematic diagram illustrating an embodiment of the summation elements of FIG. 3. The summation circuitry 400 includes an amplification stage 410, referred to as a "GM stage," and a passive summation stage 420.

The amplification stage 410 comprises transistors 402, 404, 406, 408, 412, 414, 416, 418, 422 and 424. The transistors are illustrated as bipolar junction transistor (BJT) devices; however, other transistor technologies may be implemented. The transistors 402 and 404 are arranged in a differential amplifier configuration. Similarly, the transistors 406 and 408, the transistors 412 and 414, the transistors 416 and 418, and the transistors 422 and 424 are also arranged in a differential amplifier configuration.

The input to the base terminal of the transistor 402 and the base terminal of the transistor 412 is the 0 degree output of the divider 320 of FIG. 3. The input to the base terminal of the transistor 404 and the transistor 414 is the 180 degree output (opposite phase of the 0 degree output) of the divider 320 of FIG. 3.

The input to the base terminal of the transistor 406 and the base terminal of the transistor 416 is the 60 degree output of the divider 320 of FIG. 3. The input to the base terminal of the transistor 408 and the transistor 418 is the 240 degree output (opposite phase of the 60 degree output) of the divider 320 of FIG. 3.

The input to the base terminal of the transistor 422 is the 120 degree output of the divider 320 of FIG. 3. The input to the base terminal of the transistor 424 is the 300 degree output (opposite phase of the 120 degree output) of the divider 320 of FIG. 3.

The collector terminal of the transistor 432 is coupled to the emitter terminals of the transistors 402 and 404 and operates as a current mirror transistor. The base terminal of the transistor 432 is connected to a current mirror bias signal. The emitter terminal of the transistor 432 is coupled via resistor 439 to negative supply Vss, which is ground in this particular implementation. The transistor 432 and the resistor 439 form a current source. Any other type of current source can be used in other implementations. Similarly, the collector terminal of the transistor 434 is coupled to the emitter terminals of the transistors 406 and 408 and operates as a current mirror transistor. The base terminal of the transistor 434 is connected to a current mirror bias signal. The emitter terminal of the transistor 434 is coupled via resistor 442 to the negative supply Vss.

The collector terminal of the transistor 436 is coupled to the emitter terminals of the transistors 412 and 414 and operates as a current mirror transistor. The base terminal of the transistor 436 is connected to a current mirror bias signal. The emitter terminal of the transistor 436 is coupled via resistor 444 to the negative supply Vss.

The collector terminal of the transistor 437 is coupled to the emitter terminals of the transistors 416 and 418 and operates as a current mirror transistor. The base terminal of the transistor 437 is connected to a current mirror bias signal. The emitter terminal of the transistor 437 is coupled via resistor 446 to the negative supply Vss.

The collector terminal of the transistor 438 is coupled to the emitter terminals of the transistors 422 and 424 and operates as a current mirror transistor. The base terminal of the transistor 438 is connected to a current mirror bias signal. The emitter terminal of the transistor 438 is coupled via resistor 447 to the negative supply Vss.

The collector terminal of the transistors 402 and 406 are coupled to Vcc via connection 448 and resistor 471. The collector terminal of the transistors 404 and 408 are coupled to Vcc via connection 449 and resistor 486. The collector terminal of the transistors 412, 418 and 424 are coupled to Vcc via connection 452 and resistor 492. The collector terminal of the transistors 414, 416 and 422 are coupled to Vcc via connection 451 and resistor 478.

The capacitors 472 and 474 create the 0 degree output of the passive summation stage 420 on connection 476. The capacitors 457 and 458 create the 45 degree output of the passive summation stage 420 on connection 467. The capacitors 479 and 481 create the 90 degree output of the passive summation stage 420 on connection 482. The capacitors 459 and 462 create the 135 degree output of the passive summation stage 420 on connection 468.

The capacitors 487 and 488 create the 180 degree output of the passive summation stage 420 on connection 489. The capacitors 464 and 466 create the 225 degree output of the passive summation stage 420 on connection 469. The capacitors 494 and 496 create the 270 degree output of the passive summation stage 420 on connection 497. The capacitors 454 and 460 create the 315 degree output of the passive summation stage 420 on connection 456. In this manner nominal 45 degree phase offset LO signals are generated using only passive components.

The 0, 45, 90, 135, 180, 225, 270 and 315 degree output signals are generated in the case of a subharmonic mixer, which uses nominal 45 degree phase shifted signals at half the nominal LO frequency. In the case of a conventional mixer, only the 0, 90, 180 and 270 degree phase shifted signals at the nominal LO frequency are generated.

Figure 5:
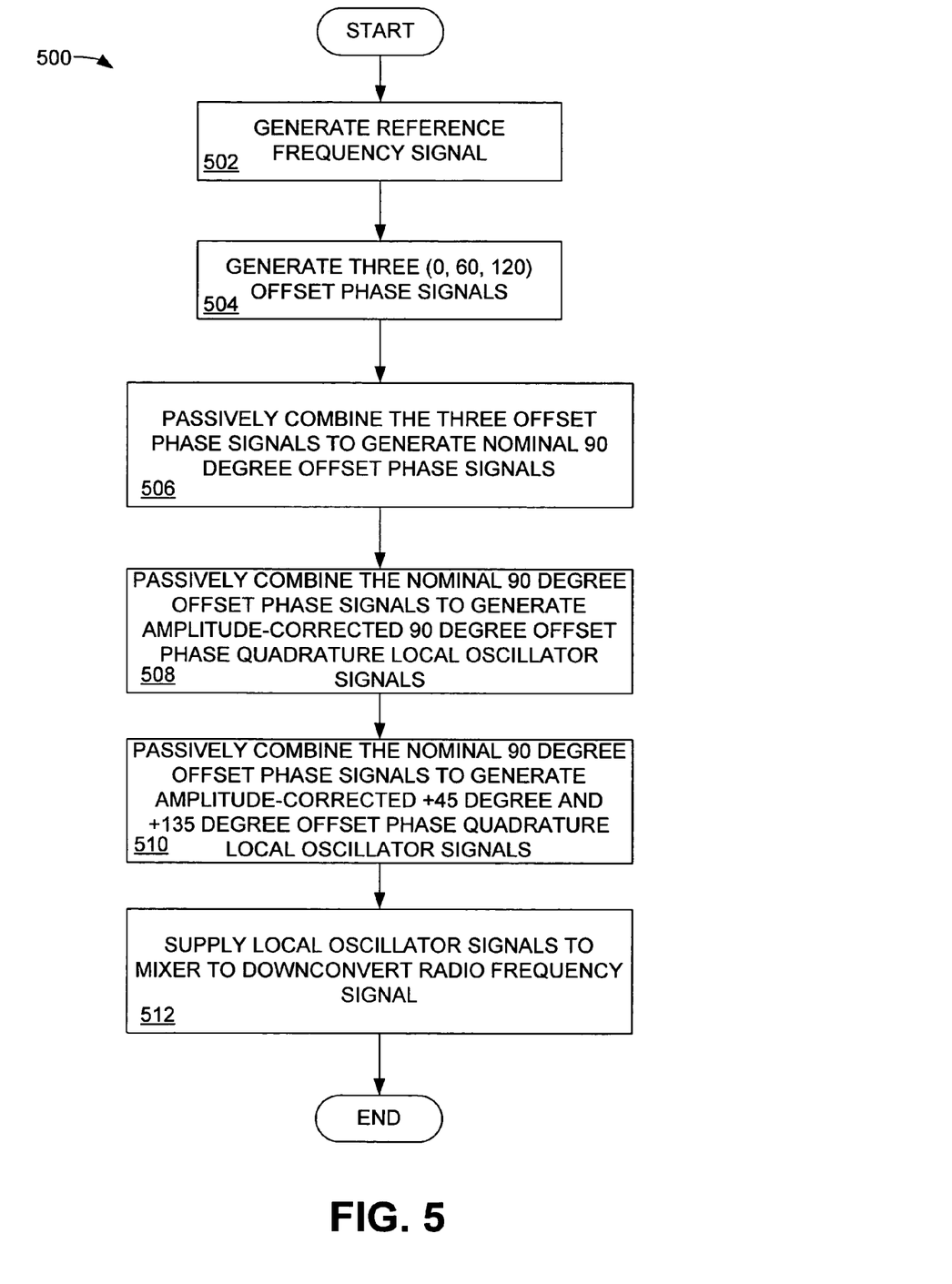
FIG. 5 is a flowchart illustrating the operation of an embodiment of the system and method for generating local oscillator (LO) signals for a quadrature mixer.

FIG. 5 is a flowchart 500 illustrating the operation of an embodiment of the system and method for generating local oscillator (LO) signals for a quadrature mixer. The blocks in the flowchart can be performed by the elements described above, or can be performed by different elements. In block 502 a reference frequency signal is generated by the VCO 302 (FIG. 3). In block 504, three offset phase signals are generated by the divider 320 (FIG. 3). In block 506, the three offset phase signals are passively combined to generate nominal 90 degree offset phase signals. In block 508, the 90 degree offset phase signals are passively combined to generate amplitude-corrected 90 degree offset phase quadrature local oscillator signals. In block 510, the 90 degree offset phase signals are passively combined to generate amplitude-corrected +45 and +135 degree offset phase quadrature local oscillator signals. In block 512, the 90 degree offset phase quadrature local oscillator signals are supplied to a mixer to downconvert a radio frequency signal.

Figure 6:
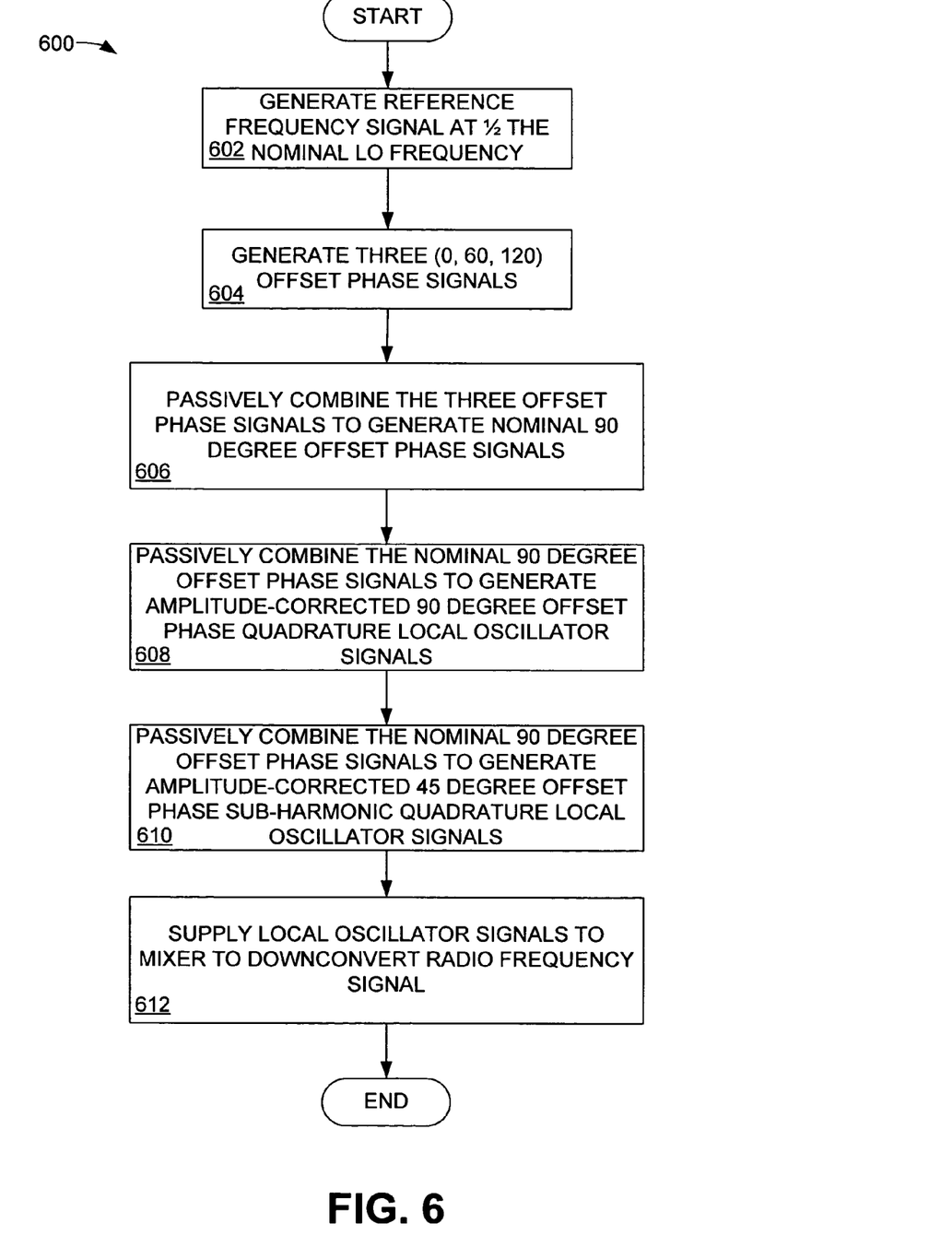
FIG. 6 is a flowchart illustrating the operation of an embodiment of the system and method for generating local oscillator (LO) signals for a sub-harmonic quadrature mixer.

FIG. 6 is a flowchart 600 illustrating the operation of an embodiment of the system and method for generating local oscillator (LO) signals for a sub-harmonic quadrature mixer. The blocks in the flowchart can be performed by the elements described above, or can be performed by different elements. In block 602 a reference frequency signal is generated at half the nominal LO frequency by the VCO 302 (FIG. 3). In block 604, three offset phase signals are generated by the divider 320 (FIG. 3). In block 606, the three offset phase signals are passively combined to generate nominal 90 degree offset phase signals. In block 608, the 90 degree offset phase signals are passively combined to generate amplitude-corrected 90 degree offset phase quadrature local oscillator signals. In block 610, the 90 degree offset phase signals are passively combined to generate amplitude-corrected 45 degree offset phase quadrature local oscillator signals. In block 612, the 45 degree offset phase quadrature local oscillator signals are supplied to a mixer to downconvert a radio frequency signal.

While various embodiments of the invention have been described, it will be apparent to those of ordinary skill in the art that many more embodiments and implementations are possible that are within the scope of this invention.

What is claimed is:

1. A system for generating local oscillator (LO) signals for a quadrature mixer, comprising:
    an oscillator configured to provide a reference frequency signal;
    at least one frequency divider configured to divide the reference frequency signal into three offset phase signals having the same frequency as each other;
    a first summing circuit configured to generate two nominal 90 degree offset phase signals from the three offset phase signals, each of the two nominal 90 degree offset phase signals being generated from a plurality of the three offset phase signals; and
    a second summing circuit configured to generate at least two amplitude-corrected 90 degree offset-phase quadrature LO signals from the two nominal 90 degree offset phase signals.

2. The system of claim 1, in which the first summing circuit and the second summing circuit comprise passive circuitry.

3. The system of claim 1, in which the second summing circuit further generates at least two additional amplitude-corrected 90 degree offset-phase quadrature LO signals for use with a subharmonic mixer.

4. The system of claim 1, in which the first summing element eliminates even multiple frequency harmonics from the reference frequency signal, thus providing frequency independent broadband operation.

5. The system of claim 1, in which the first summing element cancels a third harmonic of the reference frequency signal.

6. The system of claim 2, in which the first summing circuit and the second summing circuit comprise resistive (R) and capacitive (C) elements.

7. A portable transceiver having a system for generating local oscillator (LO) signals for a quadrature mixer, comprising:
    a transmitter operatively coupled to a receiver;
    an oscillator configured to provide a reference frequency signal;
    at least one frequency divider configured to divide the reference frequency signal into three offset phase signals having the same frequency as each other;
    a first summing circuit configured to generate two nominal 90 degree offset phase signals from the three offset phase signals, each of the two nominal 90 degree offset phase signals being generated from a plurality of the three offset phase signals; and
    a second summing circuit configured to generate at least two amplitude-corrected 90 degree offset-phase quadrature LO signals from the two nominal 90 degree offset phase signals.

8. The transceiver of claim 7, in which the first summing circuit and the second summing circuit comprise passive circuitry.

9. The transceiver of claim 7, in which the second summing circuit further generates at least two additional amplitude-corrected 90 degree offset-phase quadrature LO signals for use with a subharmonic mixer.

10. The transceiver of claim 7, in which the first summing element eliminates even multiple frequency harmonics from the reference frequency signal, thus providing frequency independent broadband operation.

11. The transceiver of claim 10, in which the first summing element cancels a third harmonic of the reference frequency signal.

12. The transceiver of claim 8, in which the first summing circuit and the second summing circuit comprise resistive (R) and capacitive (C) elements.

13. A method for generating local oscillator (LO) signals for a quadrature mixer, comprising:
    providing a reference frequency signal;
    dividing the reference frequency signal into three offset phase signals;
    generating two nominal 90 degree offset phase signals from the three offset phase signals having the same frequency as each other by generating each of the two nominal 90 degree offset phase signals from a plurality of the three offset phase signals; and
    generating at least two amplitude-corrected 90 degree offset-phase quadrature LO signals from the two nominal 90 degree offset phase signals.

14. The method of claim 13, in which the generating steps comprise passive combining.

15. The method transceiver of claim 13, further comprising generating at least two additional amplitude-corrected 90 degree offset-phase quadrature LO signals for use with a subharmonic mixer.

16. The method of claim 13, in which the generating eliminates even multiple frequency harmonics from the reference frequency signal, thus providing frequency independent broadband operation.

17. The method of claim 13, in which the generating cancels a third harmonic of the reference frequency signal.

18. The method of claim 13, in which the generating is performed by passive resistive (R) and capacitive (C) elements.

* * * * *